(12) United States Patent
Bégin et al.

(10) Patent No.: US 6,366,394 B1
(45) Date of Patent: Apr. 2, 2002

(54) GAIN-LOCKED DUAL STAGE OPTICAL AMPLIFIER

(75) Inventors: Michel Bégin, Québec; Jocelyn Lauzon, Saint-Augustin-de-Desmaures; Yvan Mimeault, Cap-Rouge; Yves Rouleau, Saint-Nicolas, all of (CA)

(73) Assignee: Institut National d'Optique, Sainte-Foy (CA)

( * ) Notice: Subject to any disclaimer, the term of this patent is extended or adjusted under 35 U.S.C. 154(b) by 0 days.

(21) Appl. No.: 09/548,134

(22) Filed: Apr. 14, 2000

(51) Int. Cl.$^7$ .................................................. H01S 3/00
(52) U.S. Cl. .................................. 359/341.3; 359/341.4
(58) Field of Search ....................... 359/341.4, 341.41, 359/341.33, 341.3

(56) References Cited

U.S. PATENT DOCUMENTS 5,633,740 A * 5/1997 Nogiwa et al. ............. 359/341
5,923,462 A 7/1999 Van der Plaats ............ 359/341

OTHER PUBLICATIONS

Analysis of Dynamic Pump–Loss Constrolled Gain–Locking System for Erbium–Doped Fiber Amplifiers; M. Karásek and JC. van der Plaats, IEEE Photonics Technology Letters, vol. 10, No. 8, Aug. 1998.
WDM EDFA Gain Characterization with a Reduced Set of Saturating Channels; D.M. Baney and J. Stimple; IEEE Photonic Technology Letters, vol. 8, No. 12, Dec. 1996.
EDFA Transient Response to Channel Loss in WDM Transmission System; A.K. Srivastava, Member IEEE, Y. Sun, Member IEEE, J.L. Zyskind, Member IEEE, and J.W. Sulhoff; IEEE Photonics Technology Letters, vol. 9, No. 3, Mar. 1997.
All–Optical Gain Control of In–line Erbium–Doped Fiber Amplifiers for Hybrid Analog/Digital WDM Systems; Hongxing Dai, Member, IEEE, Jin–Yi Pan, and Chinion Lin, Fellow, IEEE; IEEE Photonics Technology Letters, vol. 9, No. 6, Jun. 1997.
1480 nm pumped erbium doped fibre amplifer with all optical automatic gain control; J.F. Massicott, S.D. Wilson, R. Wyatt, J.R. Armitage, R. Kashyap, D. Williams and R.A. Lobbett; Electronics Letters $9^{th}$ Jun. 1994; vol. 30; No. 12.
Dynamic compensation of transient gain saturation in erbium–doped fiber amplifiers by pump feedback control OFC/iOOC'93 Technical Digest.
Fast Gain Control in an Erbium–Doped Fiber Ampl;ifier; A.K. Srivastava, Y. Sun, J.L. Zyskind, J.W. Sulhoff, C. Wolf and R. W. Tkach; OSA TOPS on Optical Amplifiers and Theirs Applications, 1996; vol. 5 1996 OAA Program Committee; 1996 Optical Society of America.

* cited by examiner

Primary Examiner—Mark Hellner
(74) Attorney, Agent, or Firm—Merchant & Gould P.C.

(57) ABSTRACT

A gain-locked dual stage or multi stage optical amplifier. The input signal is injected into an optical waveguide, such as an optical fiber, provided with at least a first and a second amplifying stage. Each amplifying stage is pumped by a corresponding pump source producing a pump signal having an initial pump power value. Means are provided to monitor the initial pump power of the first pump source, the initial pump power of the second pump source and the pump power of the portion of this signal unabsorbed by the first amplifying stage. The initial pump power of the first and second pump signals are controlled together, being set to a same controlled value which is calculated based on the pump power of the unabsorbed signal from the first amplifying stage.

19 Claims, 4 Drawing Sheets

GAIN-LOCKED DUAL STAGE OPTICAL AMPLIFIER

FIELD OF THE INVENTION

The present invention relates to optical communication devices and more particularly concerns a gain-locked, dual or multi-stage optical amplifier.

BACKGROUND OF THE INVENTION

In WDM communication systems containing optical amplifiers, adding or dropping one or several channels can cause high fluctuations in the remaining channels that may be detrimental to the system operation. In the case of channel dropping, the surviving channels will experience a power increase up to several decibels that may give rise to higher bit-error-rate (BER) due to receiver overload or to nonlinear phenomena such as stimulated Brillouin scattering if the power threshold is exceeded. When channels are added, the main problem is a degraded BER due to a decreased channel power at the receiver. It is therefore necessary to provide means for maintaining a constant WDM gain spectrum under various conditions.

Several techniques have been proposed for this purpose. Known in the art are the publications of K. Motoshima et al, "*Dynamic compensation of transient gain saturation in erbium-doped fiber amplifiers by pump feedback control*", Tech. Dig. OFC'93, pp. 40–42 (1993), and A. K. Srivastava et al, "*Fast gain control in an erbium-doped fiber amplifier*", Tech. Dig. OAA'96 pp. 24–27 (1996), where a probe signal at the output of the amplifier is sampled, and its power is kept constant by adjusting the pump laser power when input channels are added or dropped. The main drawback of these methods is that it involves having one channel dedicated to gain locking.

All-optical gain-clamped amplifiers were also demonstrated (see for example H. Dai et al., "*All-optical gain control of In-line erbium-doped fiber amplifiers for hybrid analog/digital WDM systems*", IEEE Photon. Tech. Lett., vol 9, pp. 737–739 (1997) and J. F. Massicott et al. "*1480 nm pumped erbium-doped fibre amplifier with all optical automatic gain control*", Electron. Lett. vol 30, pp. 962–964 (1994)). In this method, the population inversion, hence the gain, is clamped by lasing action at a wavelength outside of the amplification band. Both linear and loop configurations were proposed. The main drawbacks of this type of method is the presence, if not filtered, of an undesirable laser signal at the output of the amplifier and the required additional optical components that may increase the noise figure of the amplifier. Furthermore this technique is very sensitive to the laser wavelength stability and laser cavity loss.

There is also known in the art a technique to achieve gain locking using the pump power loss monitoring as disclosed in M. Karasek "*Analysis of dynamic pump-loss controlled gain-locking system for erbium-doped fiber amplifiers*", IEEE Photon. Tech. Lett. vol 10, pp. 1171–1173 (1998). In this technique, the gain is locked by maintaining constant the ratio of the launched pump power to the unabsorbed pump power, as illustrated in the enclosed FIG. 1 (prior art). Advantageously, such a method requires only a few additional optical components and a simple electronic circuitry for the feedback loop. Karasek et al. used this technique in a single stage amplifier configuration and good results were obtained. In this technique, the gain is locked to the desired value by keeping constant the ratio of the launched pump power to the unabsorbed pump power, the launched pump power being therefore given by the equation:

$$P_{launched} = k \cdot P_{unabsorbed}$$

However, for dual-stage amplifiers, keeping a constant ratio as above for each stage does not give a constant gain, as illustrated in FIG. 2 (prior art), showing the resulting WDM gain for a given launched power. The gain was measured using the saturating tone method, as described in D. M. Baney et al. "*WDM EDFA gain characterization with a reduced set of saturating channels*", IEEE Photon. Tech. Lett. vol 8, pp 1615–1617 (1996). In this method, the saturation level when several WDM channels are present at the input of the amplifier is replicated using a single saturating tone. The WDM gain is then measured over the operating bandwidth of the amplifier using a tunable laser. A saturating tone at a wavelength of 1550 nm was used for the measurements reported in FIG. 2, and the WDM gain was measured at 1540 nm. The ratio k for each stage was first set to the nominal operating pump powers and the power level of the saturating tone was adjusted to get the desired WDM gain of 20 dB at 1540 nm. The WDM gain was then measured at different power levels of the saturating tone while keeping the ratio for each stage constant by setting their respective launch pump power accordingly. As can be seen, the gain deviation reaches a value as high as 8 dB at low power values of the saturating tone, which is unacceptable for standard WDM applications.

OBJECTS AND SUMMARY OF THE INVENTION

It is therefore an object of the present invention to provide a gain-locked dual or multi-stage optical amplifier.

It is also an object of the invention to provide a method for amplifying an optical input signal while keeping the amplifying gain constant.

Accordingly, the present invention provides a gain-locked dual stage optical amplifier for amplifying an input signal. The amplifier includes an optical waveguide, wherein the input signal propagates. The optical waveguide has a first and a second amplifying stage, for consecutively amplifying the input signal.

A first pump source, coupled to the first amplifying stage for launching a first pump signal therein, is also provided. The first pump signal has an initial pump power $P_{i1}$. A fraction of the initial pump power $P_{i1}$ propagates through the first amplifying stage without being absorbed thereby, defining an unabsorbed pump signal having a pump power $P_u$. The amplifier also includes a second pump source coupled to the second amplifying stage for launching a second pump signal therein. The second pump signal has an initial pump power $P_{i2}$.

Monitoring means are also provided for monitoring the initial pump power $P_{i1}$ of the first pump signal, the initial pump power $P_{i2}$ of the second pump signal and the pump power $P_u$ of the unabsorbed pump signal, and controlling means are included for controlling the initial pump power $P_{i1}$ and $P_{i2}$ of the first and second pump signals. The controlling means set both of said initial pump power $P_{i1}$ and $P_{i2}$ to a same controlled value, depending on the pump power $P_u$ of the unabsorbed pump signal.

Similarly, the present invention also provides a gain-locked multi-stage optical amplifier for amplifying an input signal. The amplifier has an optical waveguide, the input signal propagating therein. The optical waveguide has a first amplifying stage and a plurality of additional amplifying stages for consecutively amplifying the input signal.

The amplifier further has a first pump source coupled to the first amplifying stage for launching a first pump signal therein. The first pump signal has an initial pump power $P_{i1}$, a fraction of said initial pump power $P_{i1}$, propagating through the first amplifying stage without being absorbed thereby to define an unabsorbed pump signal having a pump power $P_u$.

An additional pump source is provided for each of the additional amplifying stages. Each additional pump source is coupled to the corresponding amplifying stage for launching a secondary pump signal therein. Each secondary pump signal has an initial pump power $P_{in}$.

Monitoring means for monitoring the initial pump power $P_{i1}$ of the first pump signal, the initial pump power $P_{in}$ of each of the additional pump signals and the pump power $P_u$ of the unabsorbed pump signal are included, as are controlling means for controlling the initial pump power $P_{i1}$ and $P_{in}$ of the first pump signal and of each of the secondary pump signals. The controlling means sets the initial pump power $P_{i1}$ and all of the initial pump powers $P_{in}$ to a same controlled value depending on the pump power $P_u$ of the unabsorbed pump signal.

The present invention also provides a method for amplifying an optical input signal. The method includes the following steps:

a) propagating the input signal in an optical waveguide having a first and a second amplifying stage therein for consecutively amplifying said input signal;

b) launching a first pump signal in the first amplifying stage, the first pump signal having an initial pump power Pi, a fraction of said initial pump power $P_{i1}$ propagating through the first amplifying stage without being absorbed thereby to define an unabsorbed pump signal having a pump power $P_u$;

c) launching a second pump signal in the second amplifying stage, the second pump signal having an initial pump power $P_{i2}$;

d) monitoring the initial pump power $P_{i1}$ of the first pump signal, the initial pump power $P_{i2}$ of the second pump signal and the pump power $P_u$ of the unabsorbed pump signal; and e) controlling the initial pump power $P_{i1}$ and $P_{i2}$ of the first and second pump signals by setting both of said initial pump power $P_{i1}$ and $P_{i2}$ to a same controlled value depending on the pump power $P_u$ of the unabsorbed pump signal.

The present invention and its advantages will be better understood upon reading the following non restrictive description of preferred embodiments thereof, made with reference to the accompanying drawings.

DESCRIPTION OF PREFERRED
EMBODIMENTS OF THE INVENTION

Figure 1:
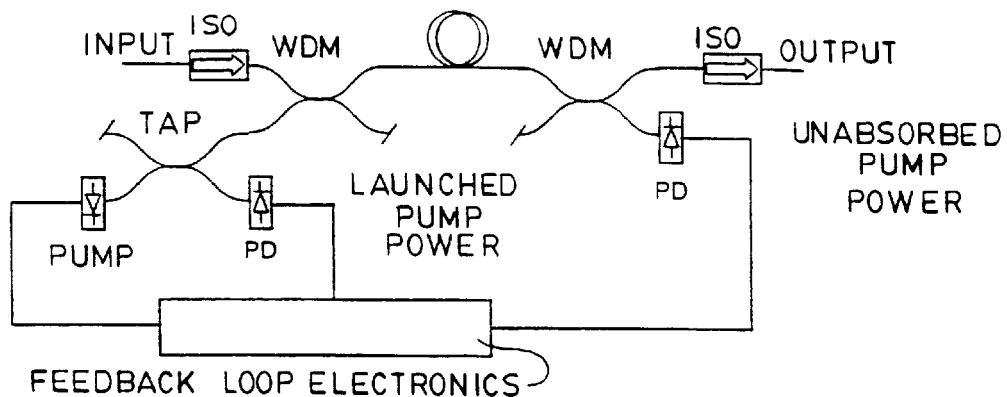
FIG. 1 (PRIOR ART) is a schematic representation of a single-stage gain-locking amplifier.
Figure 2:
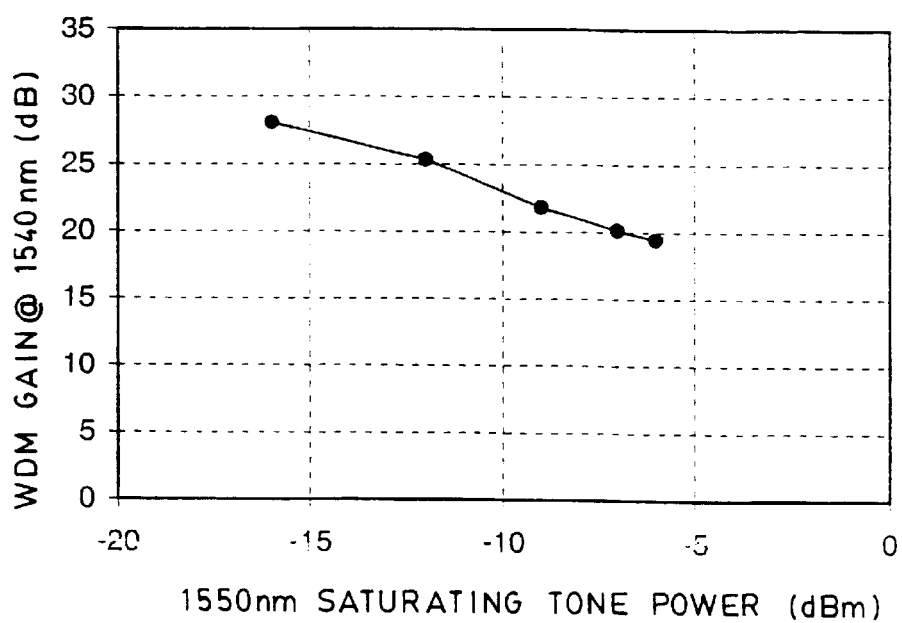
FIG. 2 (PRIOR ART) is a graph showing the gain vs the saturating tone power for a dual-stage amplifier using a standard pump loss technique.
Figure 3:
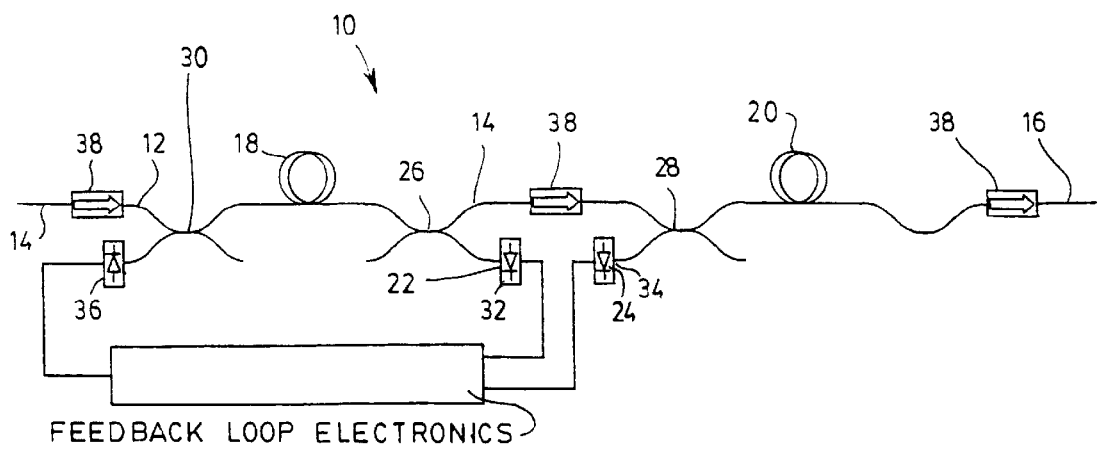
FIG. 3 is a schematic representation of a dual-stage gain locking amplifier according to a preferred embodiment of the present invention.

Referring to FIG. 3, there is shown a gain-locked dual stage optical amplifier 10 for amplifying an input signal in accordance with a preferred embodiment of the present invention. The amplifier is realized in an optical waveguide, preferably embodied by an optical fiber 12. The input signal is injected into the fiber 12 at the input 14, and is extracted after amplification at the output 16 of the optical fiber 12. Optical isolators 38 may be provided as needed such as at both the input 14 and output 16 of the amplifier 10, as well as between the two amplifying stages.

A first and a second amplifying stage 18 and 20 are provided in the fiber 12, both preferably embodied by a length of optical fiber doped with a rare earth element such as erbium. The first and second amplifying stages are respectively pumped by a first and a second pump source 22 and 24. In the preferred embodiment, the first pump source 22 is a 980 nm laser diode coupled to the first amplifying stage 18 downstream of the input 14 so that the first amplifying stage 18 is backward pumped. A first 1550/980nm WDM coupler 26 is provided for coupling the first pump source 22 to the first amplifying stage 18. The second amplifying stage 20 is preferably forward pumped by another 980 nm laser diode which is coupled thereto by a second 1550/980nm WDM coupler 28.

The first pump source 22 launches, in the first amplifying stage 18, a first pump signal having an initial pump power $P_{i1}$. A fraction of the initial pump power $P_{i1}$ propagates through the first amplifying stage 18 without being absorbed, and defines an unabsorbed pump signal having a pump power $P_u$. The unabsorbed pump signal is preferably coupled out of the fiber 12 by a third 1550/980nm WDM coupler 30. The second pump signal, launched in the second amplifying stage 20 by the second pump source 24, has an initial pump power $P_{i2}$.

The amplifier 10 is further provided with monitoring means for monitoring the initial pump power $P_{i1}$ of the first pump signal, the initial pump power $P_{i2}$ of the second pump signal, and the pump power $P_u$ of the unabsorbed pump signal and with controlling means for controlling the initial pump power $P_{i1}$ and $P_{i2}$ of the first and second pump signals. The monitoring means are preferably embodied by a first, a second and a third photodetector 32, 34 and 36, for respectively measuring the initial pump power $P_{i1}$ of the first pump signal, the initial pump power $P_{i2}$ of the second pump signal and the pump power $P_u$ of the unabsorbed pump signal. The photodetectors 32, 34 and 36 are all connected to the controlling means. Preferably, the first and second photodetectors 32 and 34 are integral to the first and second pump sources 22 and 24.

The controlling means are embodied by any appropriate feedback loop electronics. In operation, the feedback loop sets both of the initial pump powers $P_{i1}$ and $P_{i2}$ to a same controlled value, which depends on the pump power $P_u$ of the unabsorbed pump signal. Preferably, this controlled value is given by the equation:

$$P_{i1} = P_{i2} = k1 \cdot P_u + k2$$

where k1 and k2 are calibration constants. For example, k1 and k2 may be determined by using the following calibration method. First, a calibration signal having a given power value is launched in the waveguide, and both of the initial pump power $P_{i1}$ and $P_{i2}$ of the first and second pump signals are set to a same starting value. Preferably, this starting value is chosen so that the first pump source is operated at its nominal operating power. The power value of the calibration signal is then adjusted so that a predetermined gain is reached by the optical amplifier, and $P_{i1}$ and $P_u$ are measured in this operating condition. The power value of the calibration signal is then decreased by a certain amount, depending on the desired WDM gain (for instance, 10 dB). The initial pump power $P_{i1}$ and $P_{i2}$ of the first and second pump signals are gradually decreased until the predetermined gain is reached by the optical amplifier. $P_{i1}$ and $P_u$ are again measured, and k1 and k2 may be calculated using the above given equation and the measured values of $P_{i1}$ and $P_u$ in both operating positions.

The present invention also provides a method for amplifying an optical input signal. The method includes the steps of:

a) propagating the input signal in an optical waveguide having a first and a second amplifying stage therein for consecutively amplifying said input signal;

b) launching a first pump signal in the first amplifying stage, the first pump signal having an initial pump power $P_{i1}$, a fraction of said initial pump power $P_{i1}$ propagating through the first amplifying stage without being absorbed thereby to define an unabsorbed pump signal having a pump power $P_u$;

c) launching a second pump signal in the second amplifying stage, the second pump signal having an initial pump power $P_{i2}$;

d) monitoring the initial pump power $P_{i1}$ of the first pump signal, the initial pump power $P_{i2}$ of the second pump signal, and the pump power $P_u$ of the unabsorbed pump signal; and e) controlling the initial pump power $P_{i1}$ and $P_{i2}$ of the first and second pump signals by setting both of said initial pump power $P_{i1}$ and $P_{i2}$ to a same controlled value depending on the pump power $P_u$ of the unabsorbed pump signal.

The present method may of course be embodied by any appropriate apparatus such as the one described above.

Figure 4:
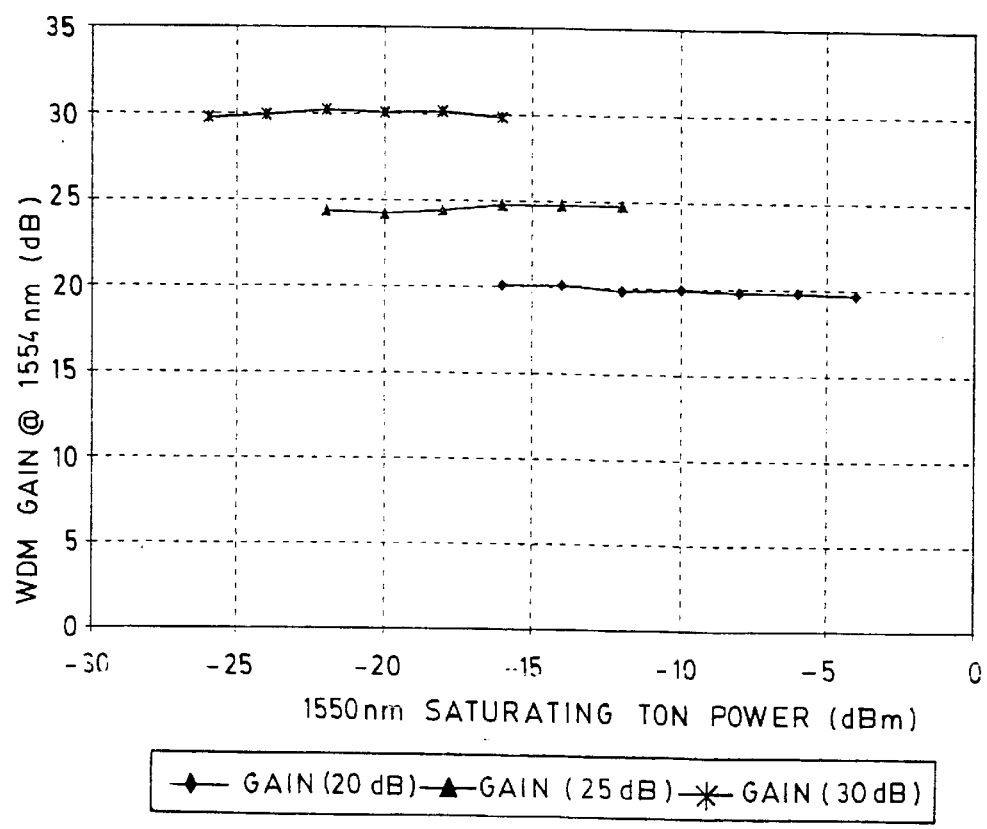
FIG. 4 is a graph showing the gain vs the saturating tone power for a dual-stage amplifier operated at different pump power values according to the preferred embodiment of the present invention.
Figure 5:
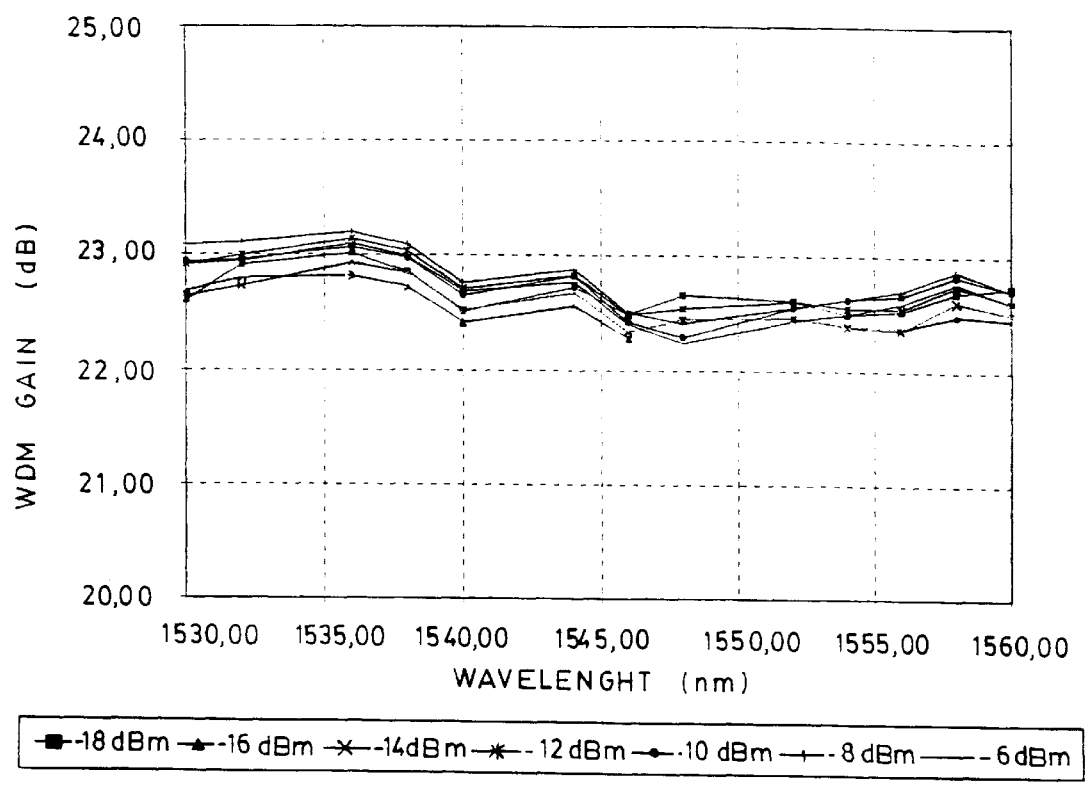
FIG. 5 is a graph showing the 23 dB gain spectrum at different input power values of the saturing tone.

Referring to FIG. 4, there are shown the results obtained by an amplifier and method as described above for a WDM gain of 20, 25 and 30 dB. The WDM gain was measured at 1554 nm at different power levels of a 1550 nm input signal. The gain was locked to the desired value by changing the pump level of each stage according to the preferred embodiment of the present invention. A gain deviation of less than 0.5 dB was thereby obtained over a 10 dB range for each gain value tested. FIG. 5 shows the 23 dB WDM gain spectrum at different power values of the input signal. Once again, a very small gain deviation was observed over a 12 dB range.

Figure 6:
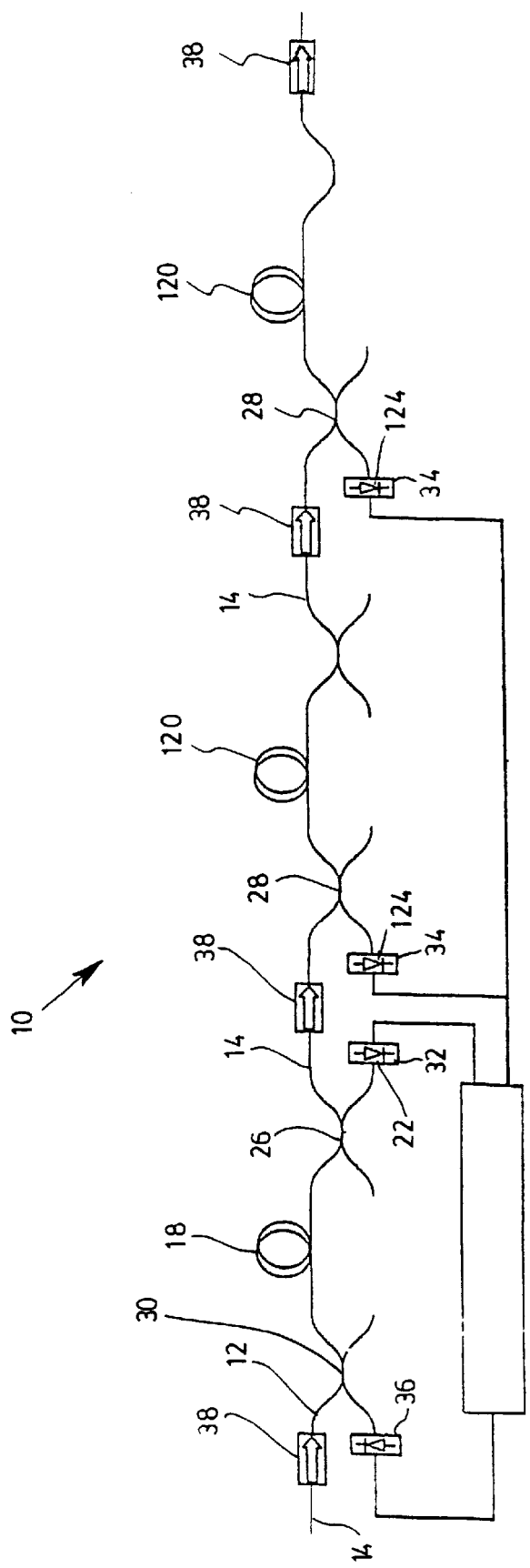
FIG. 6 is a schematic representation of a multi-stage gain locking amplifier according to another preferred embodiment of the present invention.

Referring to FIG. 6, there is shown how the present invention can easily be adapted to a multi stage optical amplifier. As with the above dualstage embodiment, the amplifier 10 has an optical waveguide embodied by an optical fiber 12, and first amplifying stage 18 preferably backward pumped by a first pump source 22. A plurality of additional amplifying stages 120 are sequentially provided downstream the first amplifying stage 18, each coupled to a corresponding additional pump source 124.

As before, the first pump signal having an initial pump power $P_{i1}$, a fraction of said initial pump power $P_{i1}$ propagating through the first amplifying stage without being absorbed thereby to define an unabsorbed pump signal having a pump power $P_u$. Each secondary pump signal has an initial pump power $P_{in}$. Monitoring means for monitoring the initial pump power $P_{i1}$ of the first pump signal, each of the initial pump power $P_{in}$ of each of the additional pump sources, and the pump power $P_u$ of the unabsorbed pump signal are provided, and controlling means control the initial pump power $P_{i1}$ and $P_{in}$ of the first pump signal and of each of the secondary pump signals. The initial pump power $P_{i1}$ and all of the initial pump powers $P_{in}$ are set to a same controlled value depending on the pump power $P_u$ of the unabsorbed pump signal. Any appropriate number of amplifying stages may be provided as required.

Of course, numerous changes could be made to the preferred embodiment disclosed hereinabove without departing from the scope of the invention as defined in the appended claims.

What is claimed is:

1. A gain-locked dual stage optical amplifier for amplifying an input signal, the amplifier comprising:

an optical waveguide, the input signal propagating therein, said optical waveguide having a first and a second amplifying stage for consecutively amplifying the input signal;

a first pump source coupled to the first amplifying stage for launching a first pump signal therein, the first pump signal having an initial pump power $P_{i1}$, a fraction of said initial pump power $P_{i1}$ propagating through the first amplifying stage without being absorbed thereby to define an unabsorbed pump signal having a pump power $P_u$;

a second pump source coupled to the second amplifying stage for launching a second pump signal therein, the second pump signal having an initial pump power $P_{i2}$;

monitoring means for monitoring the initial pump power $P_{i1}$ of the first pump signal, the initial pump power $P_{i2}$ of the second pump signal, and the pump power $P_u$ of the unabsorbed pump signal; and controlling means for controlling the initial pump power $P_{i1}$ and $P_{i2}$ of the first and second pump signals, the controlling means setting both of said initial pump power $P_{i1}$ and $P_{i2}$ to a same controlled value depending on the pump power $P_u$ of the unabsorbed pump signal.

2. An optical amplifier according to claim 1, wherein the controlled value of the initial pump power $P_{i1}$ and $P_{i2}$ of the first and second pump signals is given by the equation:

$$P_{i1} = P_{i2} = k1 \cdot P_u + k2$$

where k1 and k2 are calibration constants.

3. An optical amplifier according to claim 2, wherein the calibration constants k1 and k2 are determined by a calibration method comprising the steps of:

a) launching a calibration signal having a given power value in the waveguide;

b) setting the initial pump power $P_{i1}$ and $P_{i2}$ of the first and second pump signals to a same starting value;

c) adjusting the power value of the calibration signal so that a predetermined gain is reached by the optical amplifier;

d) measuring $P_{i1}$ and $P_u$;

e) decreasing the power value of the calibration signal;

f) gradually decreasing the initial pump power $P_{i1}$ and $P_{i2}$ of the first and second pump signals until the predetermined gain is reached by the optical amplifier;

g) measuring $P_{i1}$ and $P_u$; and h) calculating k1 and k2 based on the measurements of steps d) and g).

4. An optical amplifier according to claim 1, wherein the monitoring means comprise a first, a second and a third photodetector, for respectively measuring the initial pump power $P_{i1}$ of the first pump signal, the initial pump power $P_{i2}$ of the second pump signal and the pump power $P_u$ of the unabsorbed pump signal, each of said first, second and third photodetectors being connected to the controlling means.

5. An optical amplifier according to claim 4, wherein the first and the second photodetectors are respectively integral to the first and second pump sources.

6. An optical amplifier according to claim 1 wherein the optical waveguide is an optical fiber.

7. An optical amplifier according to claim 1, wherein the first and the second amplifying stages each comprise a rare-earth doped length of optical fiber.

8. An optical amplifier according to claim 7, wherein the rare-earth doped length of optical fiber is doped with erbium.

9. An optical amplifier according to claim 8, wherein the first and second pump sources are 980 nm laser diodes.

10. An optical amplifier according to claim 9, further comprising a first 1550/980nm WDM coupler for coupling the first pump source to the first amplifying stage.

11. An optical amplifier according to claim 10, further comprising a second 1550/980nm WDM coupler for coupling the second pump source to the second amplifying stage.

12. An optical amplifier according to claim 11, further comprising a third 1550/980nm WDM coupler for coupling the unabsorbed pump signal out of the optical fiber path.

13. An optical amplifier according to claim 1, wherein the first amplifying stage is backward pumped.

14. An optical amplifier according to claim 1, wherein the second amplifying stage is forward pumped.

15. A optical amplifier according to claim 3, wherein:
   the first and the second amplifying stages each comprise an erbium doped length of optical fiber;
   the monitoring means comprise a first and a second photodetector respectively integral to the first and second pump sources for respectively measuring the initial pump power $P_{i1}$ of the first pump signal and the initial pump power $P_{i2}$ of the second pump signal, and a third photodetector for measuring the pump power $P_u$ of the unabsorbed pump signal, each of said first, second and third photodetectors being connected to the controlling means; and
   the first and second pump sources are 980 nm laser diodes; said optical amplifier further comprising:
      a first 1550/980nm WDM coupler for coupling the first pump source to the first amplifying stage so that said first amplifying stage is backward pumped;
      a second 1550/980nm WDM coupler for coupling the second pump source to the second amplifying stage so that said second amplifying stage is forward pumped; and
      a third 1550/980nm WDM coupler for coupling the unabsorbed pump signal out of the optical fiber path.

16. A method for amplifying an optical input signal, comprising the steps of:
   a) propagating the input signal in an optical waveguide having a first and a second amplifying stage therein for consecutively amplifying said input signal;
   b) launching a first pump signal in the first amplifying stage, the first pump signal having an initial pump power $P_{i1}$, a fraction of said initial pump power $P_{i1}$ propagating through the first amplifying stage without being absorbed thereby to define an unabsorbed pump signal having a pump power $P_u$;
   c) launching a second pump signal in the second amplifying stage, the second pump signal having an initial pump power $P_{i2}$;
   d) monitoring the initial pump power $P_{i1}$ of the first pump signal, the initial pump power $P_{i2}$ of the second pump signal, and the pump power $P_u$ of the unabsorbed pump signal; and
   e) controlling the initial pump power $P_{i1}$ and $P_{i2}$ of the first and second pump signals by setting both of said initial pump power $P_{i1}$ and $P_{i2}$ to a same controlled value depending on the pump power $P_u$ of the unabsorbed pump signal.

17. A method according to claim 16, wherein step e) further comprises a sub-step of calculating the controlled value of the initial pump power $P_{i1}$ and $P_{i2}$ of the first and second pump signals with the equation:

$$P_{i1}=P_{i2}=k1 \cdot P_u+k2$$

where k1 and k2 are calibration constants.

18. A method according to claim 17, further comprising a calibration step of determining the calibration constants k1 and k2, said calibration step comprising the sub-steps of:
   i) launching a calibration signal having a given power value in the waveguide;
   ii) setting the initial pump power $P_{i1}$ and $P_{i2}$ of the first and second pump signals to a same starting value;
   iii) adjusting the power value of the calibration signal so that a predetermined gain is reached by the optical amplifier;
   iv) measuring $P_{i1}$ and $P_u$;
   v) decreasing the power value of the calibration signal;
   vi) gradually decreasing the initial pump power $P_{i1}$ and $P_{i2}$ of the first and second pump signals until the predetermined gain is reached by the optical amplifier;
   vii) measuring $P_{i1}$ and $P_u$; and
   viii) calculating k1 and k2 based on the measurements of steps iv) and vii).

19. A gain-locked multi-stage optical amplifier for amplifying an input signal, the amplifier comprising:
   an optical waveguide, the input signal propagating therein, said optical waveguide having a first amplifying stage and a plurality of additional amplifying stages for consecutively amplifying the input signal;
   a first pump source coupled to the first amplifying stage for launching a first pump signal therein, the first pump signal having an initial pump power $P_{i1}$, a fraction of said initial pump power $P_{i1}$ propagating through the first amplifying stage without being absorbed thereby to define an unabsorbed pump signal having a pump power $P_u$;
   an additional pump source for each of the additional amplifying stages, said additional pump source being coupled to the corresponding amplifying stage for launching a secondary pump signal therein, each secondary pump signal having an initial pump power $P_{in}$;
   monitoring means for monitoring the initial pump power $P_{i1}$ of the first pump signal, each of the initial pump power $P_{in}$ of each of said additional pump sources, and the pump power $P_u$ of the unabsorbed pump signal; and
   controlling means for controlling the initial pump power $P_{i1}$ and $P_{in}$ of the first pump signal, each of the secondary pump signals, the controlling means setting said initial pump power $P_{i1}$ and all of the initial pump powers $P_{in}$ to a same controlled value depending on the pump power $P_u$ of the unabsorbed pump signal.

* * * * *